United States Patent
Han et al.

(10) Patent No.: US 10,347,184 B2
(45) Date of Patent: Jul. 9, 2019

(54) PIXEL COMPENSATION CIRCUIT, DRIVING METHOD AND DISPLAY DEVICE

(71) Applicant: Shenzhen China Star Optoelectronics Technology Co., Ltd., Shenzhen, Guangdong (CN)

(72) Inventors: Baixiang Han, Guangdong (CN); Liang Sun, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 136 days.

(21) Appl. No.: 15/524,262

(22) PCT Filed: Apr. 6, 2017

(86) PCT No.: PCT/CN2017/079553
§ 371 (c)(1),
(2) Date: May 3, 2017

(87) PCT Pub. No.: WO2018/157442
PCT Pub. Date: Sep. 7, 2018

(65) Prior Publication Data
US 2018/0308426 A1 Oct. 25, 2018

(30) Foreign Application Priority Data
Mar. 2, 2017 (CN) .......................... 2017 1 0120722

(51) Int. Cl.
*G09G 3/3258* (2016.01)
*G09G 3/3266* (2016.01)
(Continued)

(52) U.S. Cl.
CPC ......... *G09G 3/3258* (2013.01); *G09G 3/3233* (2013.01); *G09G 3/3266* (2013.01);
(Continued)

(58) Field of Classification Search
CPC ... G09G 2300/0819; G09G 2310/0264; G09G 3/3233; G09G 3/3258; G09G 3/3266; G09G 3/3291; H01L 27/3262; H01L 27/3265
See application file for complete search history.

(56) References Cited

U.S. PATENT DOCUMENTS 7,205,965 B2   4/2007   Mikami et al.
7,564,452 B2   7/2009   Komiya
(Continued)

FOREIGN PATENT DOCUMENTS

| CN | 101996582 A | 3/2010 |
| CN | 102222468 A | 10/2011 |
| CN | 105096819 A | 11/2015 |

*Primary Examiner* — Viet D Pham
(74) *Attorney, Agent, or Firm* — Andrew C. Cheng

(57) ABSTRACT

A pixel compensation circuit, a driving method and a display device are disclosed. The pixel compensation circuit includes: a light-emitting element; a driving switch, a first terminal is connected to a power source voltage; a first switch and a control terminal is connected to a first scanning signal, a first terminal is connected to a data signal; a second switch, a control terminal is connected to a control signal and a first terminal is connected to the second terminal of the driving switch; a third switch, a control terminal is connected to a second scanning signal; a storage capacitor, a first terminal is connected to a control terminal of the driving switch, a second terminal is connected to the second terminal of the second switch. Through the above method, the affection of the current flowing through the light-emitting element caused by the threshold voltage of the driving switch is canceled.

12 Claims, 3 Drawing Sheets

(51) Int. Cl.
*G09G 3/3291* (2016.01)
*H01L 27/32* (2006.01)
*G09G 3/3233* (2016.01)

(52) U.S. Cl.
CPC ....... *G09G 3/3291* (2013.01); *H01L 27/3262* (2013.01); *H01L 27/3265* (2013.01); *G09G 2300/0814* (2013.01); *G09G 2300/0819* (2013.01); *G09G 2310/0264* (2013.01)

(56) References Cited

U.S. PATENT DOCUMENTS

| | | |
|---|---|---|
| 8,736,589 B2 | 5/2014 | Lee |
| 9,514,676 B2 | 12/2016 | Wu et al. |
| 2003/0103022 A1 | 6/2003 | Noguchi et al. |
| 2007/0236430 A1* | 10/2007 | Fish .................... G09G 3/3233 345/82 |
| 2008/0048949 A1* | 2/2008 | Kim .................... G09G 3/3233 345/80 |
| 2010/0220091 A1* | 9/2010 | Choi .................... G09G 3/3208 345/213 |

* cited by examiner

PIXEL COMPENSATION CIRCUIT, DRIVING METHOD AND DISPLAY DEVICE

BACKGROUND OF THE INVENTION

1. Field of the Invention

The present invention relates to a liquid crystal display technology field, and more particularly to a pixel compensation circuit, a driving method, and a display device.

2. Description of Related Art

A light-emitting diode (OLED) realizes a display through a driving TFT to control a current flowing through the OLED. In the operation process, the driving TFT is affected by illumination, a voltage stress on source and drain electrodes, etc. such that a threshold voltage is shifted. Accordingly, the current flowing through the organic light-emitting diode is affected so as to cause an uneven display of the panel.

The way to solve the uneven display is to add a compensation circuit to compensate parameters (such as the threshold voltage and mobility) of the driving switch of each pixel such that an output current is unrelated to the parameters.

SUMMARY OF THE INVENTION

The present invention provides a pixel compensation method, a driving method, a display device, and the affection of the current flowing through the light-emitting element caused by the threshold voltage of the driving switch can be canceled.

A technology solution adopted by the present invention is to provide a display device, and the display device comprises: a display panel, and the display panel comprises: multiple pixel units, and each pixel unit includes a pixel compensation circuit; a common voltage source for providing a common voltage to the pixel compensation circuit; a power source for providing a voltage to the pixel compensation circuit; a scanning driving circuit for providing a scanning signal to the pixel compensation circuit; a data driving circuit for providing a data signal to the pixel compensation circuit; and an emitting-control driving circuit for providing a control signal to the pixel compensation circuit; wherein, the pixel compensation circuit comprises: a light-emitting element, and one terminal of the light-emitting element is connected to a common voltage; a driving switch, and a first terminal of the driving switch is connected to a power source voltage for driving the light-emitting element to emit light; a first switch, and a control terminal of the first switch is connected to a first scanning signal, a first terminal of the first switch is connected to a data signal, a second terminal of the first switch is connected to a control terminal of the driving switch; a second switch, and a control terminal of the second switch is connected to a control signal, a first terminal of the second switch is connected to a second terminal of the driving switch, and a second terminal of the second switch is connected to the other terminal of the light-emitting element; a third switch, and a control terminal of the third switch is connected to the second scanning signal, wherein the third switch pulls down the second terminal of the second switch or the second terminal of the second switch to a low voltage level when the third switch is controlled to be turned on under a control of the second scanning signal; and a storage capacitor, a first terminal of the storage capacitor is connected to the control terminal of the driving switch, and a second terminal of the storage capacitor is connected to the second terminal of the second switch; wherein, the second terminal of the third switch is connected to the second terminal of the second switch, and the first terminal of the third switch is connected to the control signal; and each of the first switch, the second switch, the third switch and the driving switch is a thin-film transistor.

wherein, the light-emitting element is an organic light-emitting diode.

wherein, the power source voltage is greater than the common voltage.

In order to solve the above technology problem, another technology solution adopted by the present invention is to provide a pixel compensation circuit, wherein, the pixel compensation circuit comprises: a light-emitting element, and one terminal of the light-emitting element is connected to a common voltage; a driving switch, and a first terminal of the driving switch is connected to a power source voltage for driving the light-emitting element to emit light; a first switch, and a control terminal of the first switch is connected to a first scanning signal, a first terminal of the first switch is connected to a data signal, a second terminal of the first switch is connected to a control terminal of the driving switch; a second switch, and a control terminal of the second switch is connected to a control signal, a first terminal of the second switch is connected to a second terminal of the driving switch, and a second terminal of the second switch is connected to the other terminal of the light-emitting element; a third switch, and a control terminal of the third switch is connected to the second scanning signal, wherein the third switch pulls down the second terminal of the second switch or the second terminal of the second switch to a low voltage level when the third switch is controlled to be turned on under a control of the second scanning signal; and a storage capacitor, a first terminal of the storage capacitor is connected to the control terminal of the driving switch, and a second terminal of the storage capacitor is connected to the second terminal of the second switch.

wherein, the second terminal of the third switch is connected to the second terminal of the second switch, and the first terminal of the third switch is connected to the control signal.

wherein, the second terminal of the third switch is connected to the second terminal of the second switch, and the first terminal of the third switch is connected to a detection voltage.

wherein, the second terminal of the third switch is connected to the first terminal of the second switch, and the first terminal of the third switch is connected to a detection voltage.

wherein, each of the first switch, the second switch, the third switch and the driving switch is a thin-film transistor.

wherein, the light-emitting element is an organic light-emitting diode.

wherein, the power source voltage is greater than the common voltage.

In order to solve the above technology problem, another technology solution adopted by the present invention is to provide a driving method for the pixel compensation circuit, wherein, the driving method includes: in a first stage, turning on the first switch and the third switch; turning off the second switch and the driving switch; perform a pixel initialization; writing a reference signal to the first terminal of the first switch; and writing a low voltage level to the second terminal of the storage capacitor; in a second stage, turning on the first switch, the second switch and the driving switch; turning off the third switch, wherein the control terminal of the driving switch is maintained at a low voltage level, the power source charges the second terminal of the storage capacitor through the driving switch; when charging of the second terminal of the storage capacitor is finished, turning off the driving switch, and the storage capacitor stores a voltage difference between the control terminal and the second terminal of the driving switch; in a third stage, turning on the first switch, turning off the second switch and the third switch, wherein the driving switch is maintained in a nonconductive status, the first terminal of the storage capacitor is written with the data signal, the voltage level of the second terminal of the storage capacitor is jumped, and the storage capacitor stores the voltage difference at two terminals of the storage capacitor after jumped; and in a fourth stage, turning on the second switch, turning off the first switch and the third switch, wherein the control terminal and the second terminal of the driving switch is maintained in a conductive status, the storage capacitor is maintained with the voltage difference in the previous stage, and the light-emitting element is driven to emit light.

wherein when the first canning signal is at a high level, the first switch is controlled to be turned on, when the first scanning signal is at a low level, the first switch T1 is controlled to be turned off; when the control signal is at a high level, the second switch is controlled to be turned on, when the control signal is at a low level, the second switch is controlled to be turned off; and when the second scanning signal is at a high level, the third switch is controlled to be turned on, when the second scanning signal is at a low level, the third switch is controlled to be turned off.

The beneficial effect of the present embodiment is: providing a pixel compensation circuit, a driving method and a display device, through the pixel compensation circuit, an additional capacitor is not required, which can eliminate the affection of the current flowing through the light-emitting element caused by the threshold voltage of the driving switch.

DETAILED DESCRIPTION OF THE PREFERRED EMBODIMENT

The following content combines with the drawings and the embodiment for describing the present invention in detail. It is obvious that the following embodiments are only some embodiments of the present invention. For the person of ordinary skill in the art without creative effort, the other embodiments obtained thereby are still covered by the present invention.

Figure 1:
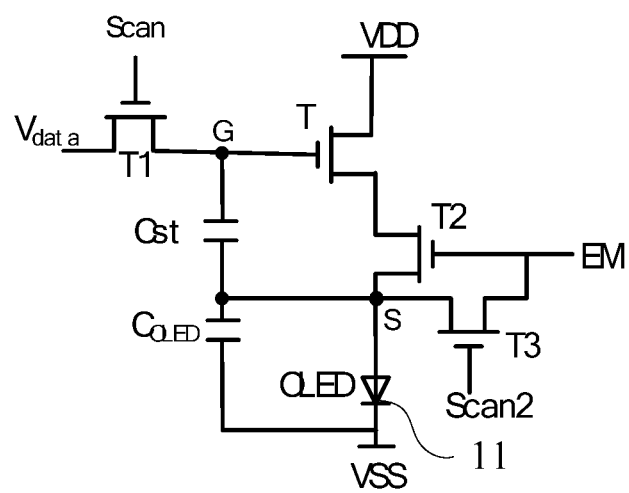
FIG. 1 is a schematic structure diagram of a pixel compensation circuit according to a first embodiment of the present invention.

With reference to FIG. 1, and FIG. 1 is a schematic structure diagram of a pixel compensation circuit according to a first embodiment of the present invention. As shown in FIG. 1, the compensation circuit 10 includes: a light-emitting element 11, a driving switch T, a first switch T1, a second switch T2, a third switch T3 and a storage capacitor Cst.

Wherein, the light-emitting element 11 is an organic light-emitting diode (OLED), one terminal of the light-emitting element 11 is connected to a common voltage VSS, and the common voltage VSS is generally a ground voltage.

A driving switch T, a first terminal of the driving switch T is connected to a power source voltage VDD for driving the light-emitting element 11 to emit light. Generally, the power source voltage VDD is greater than the common voltage VSS.

A control terminal of the first switch T1 is connected to a first scanning signal Scan, a first terminal of the first switch T1 is connected to a data signal $V_{data}$, a second terminal of the first switch T1 is connected to the control terminal of the driving switch T, and the second terminal of the first switch T1 and the driving switch T are connected at a node G.

A control terminal of the second switch T2 is connected to a control signal EM, a first terminal of the second switch T2 is connected to the second terminal of the driving switch T, and a second terminal of the second switch T2 is connected to the other terminal of the light-emitting element 11, and the second terminal of the second switch T2 and the light-emitting element 11 are connected at a node S.

A control terminal of the third switch T3 is connected to the second scanning signal Scan2, and the third switch T3 pulls down the second terminal of the second switch T2 to a low voltage level when the third switch T3 is controlled to be turned on under the control of the second scanning signal Scan2, and a first terminal of the third switch T3 is connected to the control signal EM.

A first terminal of the storage capacitor Cst is connected to the control terminal of the driving switch T, the second terminal of the storage capacitor Cst is connected to the second terminal of the second switch T2.

Wherein, the above first switch T1, the second switch T2 and the third switch T3 can be a thin-film transistor or other electronic device that can realize a switching function, and the present invention is not specifically limited. The first terminal of the switch can be a drain electrode of the switch, the second terminal of the switch can be a source electrode of the switch. In a specific embodiment, the source and drain electrodes can be exchanged, and the present invention is not specifically limited here.

In an application field of the present invention, a cathode of the light-emitting element 11 is connected to the common voltage VSS, an anode of the light-emitting element 11 is connected to the second terminal of the second switch T2. When the control signal controls the second switch T2 to be turned on and the driving switch T is turned on, the light-emitting element 11, the second switch T2 and the driving switch T form a series connection path. At this time, the current flowing through light-emitting element 11 is: $I=K(V_{gs}-V_{th})^2$, wherein, $K=W/L \times C \times u$, W is a channel width of the driving switch T, L is a channel length of the driving switch T, C is an intrinsic capacitor between the channel of the driving switch T and the control terminal, u is a carrier mobility of the channel of the driving switch T. From the above formula, to make the current flowing through light-emitting element 11 to be unrelated to the threshold voltage $V_{th}$ of the driving switch T, a voltage between the control terminal and the second terminal of the driving switch should be controlled in order to change the current flowing through the light-emitting element 11.

Figure 2:
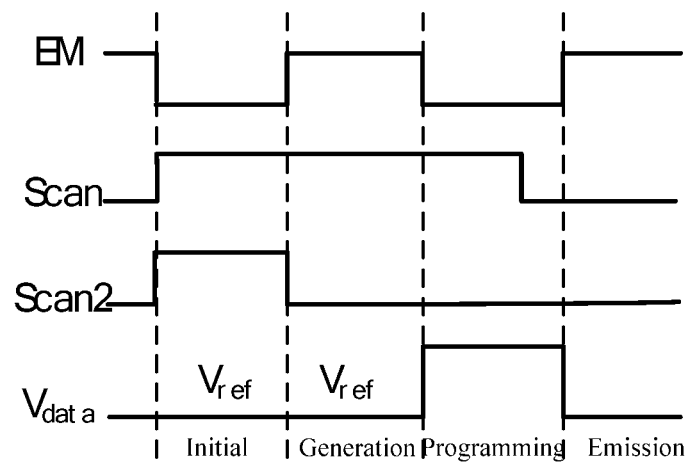
FIG. 2 is a waveform timing diagram of a pixel compensation circuit according to the first embodiment of the present invention.

With combined reference to FIG. 2, and FIG. 2 is a waveform timing diagram of a pixel compensation circuit according to the first embodiment of the present invention. As shown in FIG. 2, briefly, the entire internal compensation process can include a pixel initialization (Initial) stage, a threshold voltage generation (Generation) stage, a data programming (Programming) stage and an emission (Emission) stage, and the following content will perform a detail description for a specific compensation process.

In the present embodiment, in the Initial stage of the pixel compensation circuit 10, the first scanning signal Scan and the second scanning signal Scan2 are respectively at a high level so as to control the first switch T1 and the third switch T3 to be conductive. The control signal EM is at a low level, and the second switch T2 is turned off. The control signal EM charges the second terminal of the storage capacitor $C_{st}$ through the third switch T3. Wherein, the first terminal of the first switch T1 is written with a reference voltage $V_{ref}$, the second terminal of the third switch T3 is written with a control signal EM having a low level. In the present embodiment, because the second switch T2 is turned off, the second terminal of the driving transistor T is floating, the driving switch T is turned off, and the pixel perform an initialization. Specifically, assuming that the voltage between the control terminal and the second terminal of the driving switch T is less than or equal to the threshold voltage $V_{th}$, the driving switch T is turned off. Assuming that the voltage between the control terminal and the second terminal of the driving switch T is greater than the threshold voltage $V_{th}$, the driving switch T is turned on. Then, the power source voltage VDD charges the second terminal of the driving switch T through the driving switch T. When the voltage between the control terminal and the second terminal of the driving switch T is equal to the threshold voltage $V_{th}$ of the driving switch T, the driving switch T is turned off.

With reference to FIG. 1 and FIG. 2, in a $V_{th}$ Generation stage, the first scanning signal Scan is maintained at a high level, the first switch T1 is maintained in a conductive status, the second scanning signal Scan2 is at a low level, and controlling the third switch T2 to be in a nonconductive status. The control signal EM is at a high level, and the second switch T2 is conductive. As shown in FIG. 1, when the control terminal of the driving switch T is written with a reference signal $V_{ref}$, the reference signal $V_{ref}$ controls the driving switch T to be conductive. At this time, the voltage at the control terminal of the driving switch T is $V_{ref}$, the voltage at the first terminal of the driving switch T is the power source voltage VDD, and maintained to be unchanged, and the second terminal of the driving switch T is floating. Then, the power source voltage VDD charges the second terminal of the driving switch T through the driving switch T. In a specific embodiment, because the second switch T2 is conductive, the voltage at the node S and the voltage at the second terminal of the driving switch T are the same so that the power source voltage VDD charging the second terminal of the driving switch is equal to charge the node S. Similarly, the power source voltage VDD also charges the second terminal of the storage capacitor $C_{st}$ through the driving switch T. When the voltage level of the node S is increase to $V_{ref}-V_{th}$, the $V_{th}$ of the driving switch T is generated at the node S. When the charging is finished, the driving switch T is turned off, and the storage capacitor $C_{st}$ stores a voltage difference between the control terminal and the second terminal of the driving switch T.

With reference to FIG. 1 and FIG. 2, in the Programming stage, the first scanning signal Scan is maintained at a high level, the first switch T1 is maintained to be conductive, the control signal EM is at a low level, and controls the second switch T2 and the third switch T3 to turn off. The driving switch T maintains at a nonconductive status as the previous stage. At this time, the first terminal of the first switch T1 is written with the data signal Data, the voltage at the node G is $V_{data}$. Because in the previous stage, the voltage at the node G is $V_{ref}$, the voltage level at the node G is jumped. Correspondingly, the voltage level at the node S is also jumped.

Specifically, the variation of the voltage level of the node G is: $\Delta V(t)=V_{data}-V_{ref}$. The variation of the voltage level of the node S is: $\Delta V(t)'=\Delta V(t)*C_{st}/(C_{st}+C_{OLED})$. Wherein, $C_{OLED}$ is a coupling capacitor of the light-emitting element 11 itself. In this stage, the $C_{OLED}$ and the storage capacitor $C_{st}$ is connected in series in a path so that the voltage level jump of the node S will be affected by the capacitor $C_{OLED}$ of the light-emitting element 11, that is, a voltage dividing principle of capacitors connected in series. In the present embodiment, because the coupling capacitor $C_{OLED}$ of the light-emitting element 11 is considered, no additional capacitor is required so as to increase the precision of the pixel compensation circuit. The voltage of the node S is: $V_s=(V_{ref}-V_{th})+\Delta V(t)*C_{st}/(C_{st}+C_{OLED})$ the voltage of the node G is: $V_G=V_{data}$. At this time, the voltage difference at two terminals of the storage capacitor is: $V_{GS}=V_{data}-(V_{ref}-V_{th})-(V_{data}-V_{ref})*C_{st}/(C_{st}+C_{OLED})$. After simplification, $V_{GS}=V_{th}+(V_{data}-V_{ref})*C_{OLED}/(C_{st}-C_{OLED})$ that is, the voltage difference between the control terminal and the second terminal of the driving switch T, and the storage capacitor $C_{st}$ stores the voltage difference.

With reference to FIG. 1 and FIG. 2, in the Emitting stage, the first scanning signal Scan is at a low level so as to control the first switch T1 to turn off. The voltage level of the node G is maintained at $V_{data}$. When the second scanning signal Scan2 is at a low level, the third switch T3 is controlled to be turned off, and the voltage level of the node S is maintained at $(V_{ref}-V_{th})+\Delta V(t)*C_{st}/(C_{st}+C_{OLED})$ as the previous stage. The control signal EM is at a high level to control the second switch T2 to be conductive. The voltage difference between the control terminal and the second terminal of the driving switch T is greater than $V_{th}$, the driving switch T is conductive, the storage capacitor $C_{st}$ maintains the voltage difference in the previous stage. The driving switch T, the second switch T2 and the light-emitting element 11 is in one path connected in series, and the light-emitting element 11 starts to emit light. In the emitting stage, the current flowing through the light-emitting element 11 is: $I_{OLED}=K*(V_{GS}-V_{th})^2=K*[(V_{data}-V_{ref})*C_{OLED}/(C_{st}+C_{OLED})]^2$. It shows that the current $I_{OLED}$ flowing through light-emitting element 11 is only related to the data voltage $V_{data}$ and the reference voltage $V_{ref}$, and is unrelated to the threshold voltage $V_{th}$ of the driving switch T and the threshold voltage $V_{OLED}$ of the light-emitting element 11. Accordingly, the affection of the current $I_{OLED}$ flowing through the light-emitting element 11 caused by the threshold voltage $V_{th}$ of the driving switch is canceled.

Besides, the present invention also provides a driving method for a pixel compensation circuit. With reference to FIG. 1 and FIG. 2, in one operation period of the pixel circuit 10, the working process of the pixel circuit 10 is divided into four stages: the first stage, the second stage, the third stage and the fourth stage. The four stages are respectively corresponding to the Initial stage, the Generation stage, the Programming stage and the Emission stage of the pixel compensation circuit described above. Briefly describing as following:

In the first stage, turning on the first switch T1 and the third switch T3; turning off the second switch T2 and the driving switch T; performing a pixel initialization; writing a reference signal $V_{ref}$ to the first terminal of the first switch T1; and writing a low voltage level to a second terminal of a storage capacitor $C_{st}$.

In the second stage, turning on the first switch T1, the second switch T2 and the driving switch T; turning off the third switch T3, the control terminal of the driving switch T is maintained at a low reference voltage, the power source VDD charges the second terminal of the storage capacitor $C_{st}$ through the driving switch T. When charging of the second terminal of the storage capacitor $C_{st}$ is finished, turning off the driving switch T, and the storage capacitor $C_{st}$ stores the voltage difference between the control terminal and the second terminal of the driving switch T.

In the third stage, turning on the first switch T1, turning off the second switch T2 and the third switch T3; the driving switch T is maintained in a nonconductive status; wherein, the first terminal of the storage capacitor $C_{st}$ is written with a data signal $V_{data}$, the voltage level of the second terminal of the storage capacitor $C_{st}$ is jumped, and the storage capacitor $C_{st}$ stores the voltage difference at two terminal of the storage capacitor $C_{st}$ after jumped.

In the fourth stage, turning on the second switch T2, turning off the first switch T1 and the third switch T3. The control terminal and the second terminal of the driving switch T is maintained in a conductive status, the storage capacitor $C_{st}$ is maintained with the voltage difference in the previous stage, and the light-emitting element 11 is driven to emit light.

In the present embodiment, turning on and turning off of the above first switch T1, the second switch T2 and third switch T3 are respectively determined by the voltage levels of the first scanning signal Scan, the second scanning signal Scan2 and the control signal EM. When the first canning signal Scan is at a high level, the first switch T1 is controlled to be turned on. When the first scanning signal Scan is at a low level, the first switch T1 is controlled to be turned off. When the control signal EM is at a high level, the second switch T2 is controlled to be turned on. When the control signal EM is at a low level, the second switch T2 is controlled to be turned off. When the second scanning signal Scan2 is at a high level, the third switch T3 is controlled to be turned on, when the second scanning signal Scan2 is at a low level, the third switch T3 is controlled to be turned off.

The specific operation method of the above process can refer to the above description, no more repeating.

In the present embodiment, through the pixel compensation circuit, additional capacitor is not required, which can eliminate the affection of the current flowing through the light-emitting element caused by the threshold voltage of the driving switch.

Figure 3:
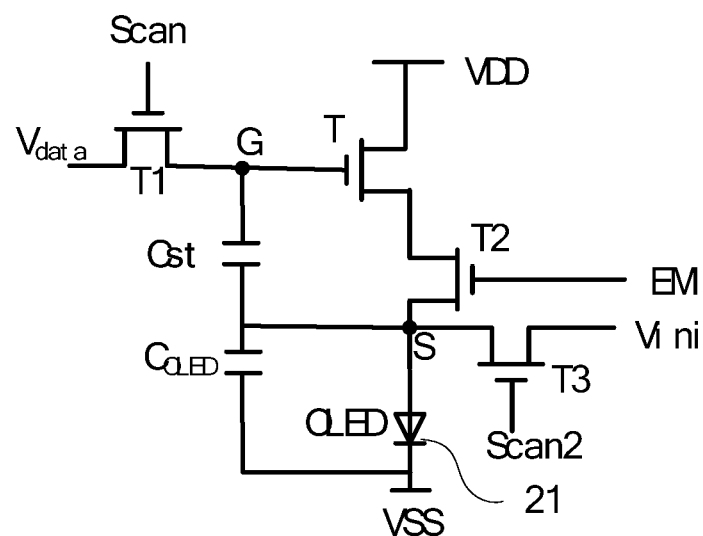
FIG. 3 is a schematic diagram of a pixel compensation circuit according to a second embodiment of the present invention.

With reference to FIG. 3, and FIG. 3 is a schematic diagram of a pixel compensation circuit according to a second embodiment of the present invention. The difference between the present embodiment and the first embodiment is: in the first embodiment, a first terminal of the third switch T3 is connected to the control signal EM, but in the present embodiment, the first terminal of the third switch T3 is connected to a detection voltage $V_{ini}$, and the specific description is as following:

As shown in FIG. 3, the compensation circuit 20 includes: a light-emitting element 21, a driving switch T, a first switch T1, a second switch T2, a third switch T3 and a storage capacitor Cst.

Wherein, the light-emitting element 21 is an organic light-emitting diode (OLED), one terminal of the light-emitting element 21 is connected with a common voltage VSS, and the common voltage VSS is generally a ground voltage.

A driving switch T, a first terminal of the driving switch T is connected to a power source voltage VDD for driving the light-emitting element 21 to emit light. Generally, the power source voltage VDD is greater than the common voltage VSS.

A control terminal of the first switch T1 is connected to a first scanning signal Scan, a first terminal of the first switch T1 is connected to a data signal $V_{data}$, a second terminal of the first switch T1 is connected to the control terminal of the driving switch T, and the second terminal of the first switch T1 and the driving switch T are connected at a node G.

A control terminal of the second switch T2 is connected with a control signal EM, a first terminal of the second switch T2 is connected to the second terminal of the driving switch T, and a second terminal of the second switch T2 is connected to the other terminal of the light-emitting element 21, and the second terminal of the second switch T2 and the light-emitting element 21 are connected at a node S.

A control terminal of the third switch T3 is connected to the second scanning signal Scan2, and the third switch T3 pulls down the voltage level of the second terminal of the second switch T2 to a low voltage level when the third switch T3 is controlled to be turned on under the control of the second scanning signal Scan2, and a first terminal of the third switch T3 is connected to the detection voltage $V_{ini}$.

A first terminal of the storage capacitor Cst is connected to the control terminal of the driving switch T, a second terminal of the storage capacitor Cst is connected to the second terminal of the second switch T2.

Wherein, the above first switch T1, the second switch T2 and the third switch T3 can be a thin-film transistor or other electronic device that can realize a switching function, and the present invention is not specifically limited.

The specific operation principle of the above pixel compensation circuit can refer to the waveform-timing diagram of the first embodiment shown in FIG. 2, the operation principle is similar, no more repeating.

Figure 4:
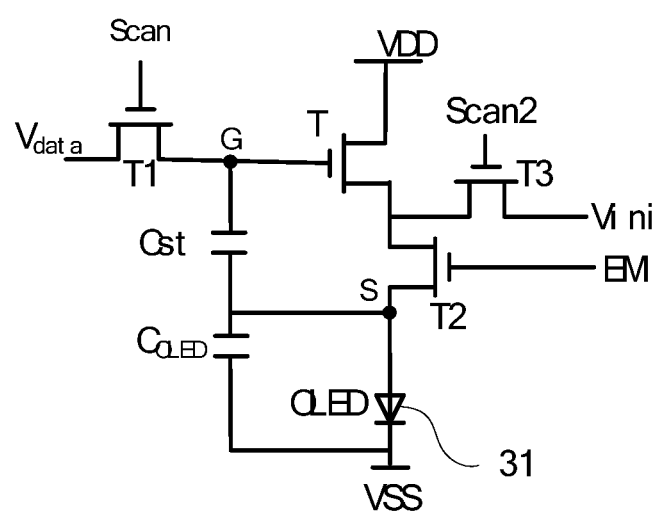
FIG. 4 is a schematic diagram of a pixel compensation circuit according to a third embodiment of the present invention.

With reference to FIG. 4, and FIG. 4 is a schematic diagram of a pixel compensation circuit according to a third embodiment of the present invention. The difference between the present embodiment and the first embodiment is: in the first embodiment, a first terminal of the third switch T3 is connected to the control signal EM, and the second terminal of the third switch T3 is connected to the second terminal of the second switch T2. In the present embodiment, the second terminal of the third switch T3 is connected to the first terminal of the second switch T2, and the first terminal of the third switch T3 is connected to a detection voltage $V_{ini}$, and the specific description is as following:

As shown in FIG. 4, the compensation circuit 30 includes: a light-emitting element 31, a driving switch T, a first switch T1, a second switch T2, a third switch T3 and a storage capacitor Cst.

Wherein, the light-emitting element 31 is an organic light-emitting diode (OLED), one terminal of the light-emitting element 31 is connected with a common voltage VSS, and the common voltage VSS is generally a ground voltage.

A driving switch T, a first terminal of the driving switch T is connected to a power source voltage VDD for driving the light-emitting element 31 to emit light. Generally, the power source voltage VDD is greater than the common voltage VSS.

A control terminal of the first switch T1 is connected to a first scanning signal Scan, a first terminal of the first switch T1 is connected to a data signal $V_{data}$, a second terminal of the first switch T1 is connected to the control terminal of the driving switch T, and the second terminal of the first switch T1 and the driving switch T are connected at a node G.

A control terminal of the second switch T2 is connected with a control signal EM, a first terminal of the second switch T2 is connected to the second terminal of the driving switch T, and a second terminal of the second switch T2 is connected to the other terminal of the light-emitting element 31, and the second terminal of the second switch T2 and the light-emitting element 31 are connected at a node S.

A control terminal of the third switch T3 is connected to the second scanning signal Scan2, and the third switch T3 pulls down the voltage level of the second terminal of the second switch T2 to a low voltage level when the third switch T3 is controlled to be turned on under the control of the second scanning signal Scan2, the second terminal of the third switch T3 is connected to the first terminal of the second switch T2, and a first terminal of the third switch T3 is connected to the detection voltage $V_{ini}$.

A first terminal of the storage capacitor Cst is connected to the control terminal of the driving switch T, a second terminal of the storage capacitor Cst is connected to the second terminal of the second switch T2.

Wherein, the above first switch T1, the second switch T2 and the third switch T3 can be a thin-film transistor or other electronic device that can realize a switching function, and the present invention is not specifically limited.

The specific operation principle of the above pixel compensation circuit can refer to the waveform-timing diagram of the first embodiment shown in FIG. 2, the operation principle is similar, no more repeating.

Figure 5:
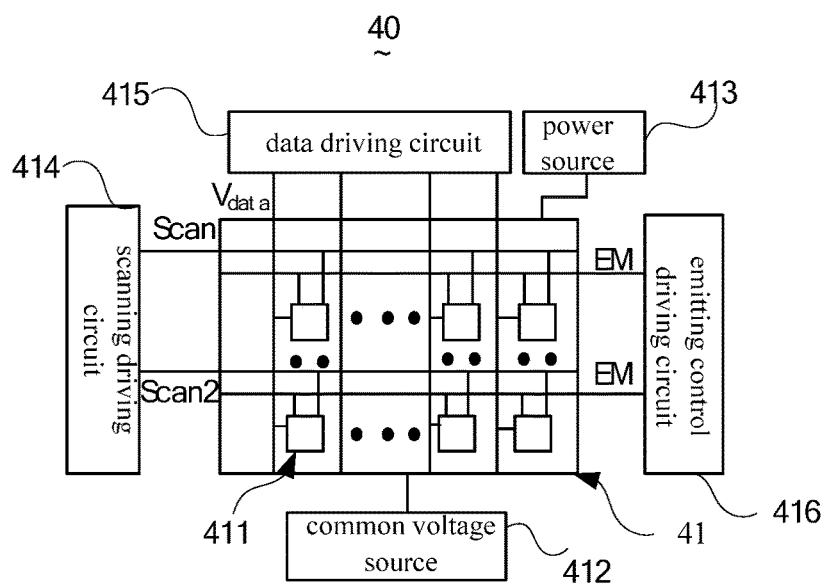
FIG. 5 is a schematic structure diagram of a display device according to an embodiment of the present invention.

With reference to FIG. 5, and FIG. 5 is a schematic structure diagram of a display device according to an embodiment of the present invention. As shown in FIG. 5, the display device 40 includes: a display panel 41, and the display panel 41 further includes: multiple pixel units 411, a common voltage source 412, a power source 413, a scanning driving circuit 414, a data driving circuit 415 and an emitting control driving circuit 416.

Wherein, each pixel unit 411 includes anyone of the above pixel compensation circuits.

A common voltage source 412 for providing a common voltage VSS to the pixel compensation circuit.

A power source 413 for providing a voltage VDD to the pixel compensation circuit.

A scanning driving circuit 414 for providing a scanning signal to the pixel compensation circuit, and the scanning signal includes a first scanning signal Scan and a second scanning signal Scan2.

A data driving circuit 415 for providing a data signal to the pixel compensation circuit, and the data signal includes a data signal $V_{data}$ and $V_{ref}$.

An emitting-control driving circuit 416 for providing a control signal EM to the pixel compensation circuit.

Wherein, the pixel compensation circuit in the present embodiment can be the pixel compensation circuit in anyone of the above embodiments, and the specific structure and operation method can refer to the above, no more repeating.

In summary, person skilled in the art can easily understand that the present invention provides a pixel compensation circuit, driving method and display device. Through the pixel compensation circuit, and no additional capacitor is required, the affection of the current flowing through the light-emitting element caused by the threshold voltage of the driving switch can be canceled.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A display device, and the display device comprises:
a display panel, and the display panel comprises:
multiple pixel units, and each pixel unit includes a pixel compensation circuit;
a common voltage source for providing a common voltage to the pixel compensation circuit;
a power source for providing a voltage to the pixel compensation circuit;
a scanning driving circuit for providing a scanning signal to the pixel compensation circuit;
a data driving circuit for providing a data signal to the pixel compensation circuit; and
an emitting-control driving circuit for providing a control signal to the pixel compensation circuit;
wherein, the pixel compensation circuit comprises:
a light-emitting element, and one terminal of the light-emitting element is connected to a common voltage;
a driving switch, and a first terminal of the driving switch is connected to a power source voltage for driving the light-emitting element to emit light;
a first switch, and a control terminal of the first switch is connected to a first scanning signal, a first terminal of the first switch is connected to a data signal, a second terminal of the first switch is connected to a control terminal of the driving switch;
a second switch, and a control terminal of the second switch is connected to a control signal, a first terminal of the second switch is connected to a second terminal of the driving switch, and a second terminal of the second switch is connected to the other terminal of the light-emitting element;
a third switch, and a control terminal of the third switch is connected to the second scanning signal, wherein the third switch pulls down the second terminal of the driving switch or the second terminal of the second switch to a low voltage level when the third switch is controlled to be turned on under a control of the second scanning signal; and
a storage capacitor, a first terminal of the storage capacitor is connected to the control terminal of the driving switch, and a second terminal of the storage capacitor is connected to the second terminal of the second switch;
wherein, the second terminal of the third switch is connected to the second terminal of the second switch, and the first terminal of the third switch is connected to the control signal; and
each of the first switch, the second switch, the third switch and the driving switch is a thin-film transistor.

2. The display device according to claim 1, wherein, the light-emitting element is an organic light-emitting diode.

3. The display device according to claim 1, wherein, the power source voltage is greater than the common voltage.

4. A pixel compensation circuit, wherein, the pixel compensation circuit comprises:
- a light-emitting element, and one terminal of the light-emitting element is connected to a common voltage;
- a driving switch, and a first terminal of the driving switch is connected to a power source voltage for driving the light-emitting element to emit light;
- a first switch, and a control terminal of the first switch is connected to a first scanning signal, a first terminal of the first switch is connected to a data signal, a second terminal of the first switch is connected to a control terminal of the driving switch;
- a second switch, and a control terminal of the second switch is connected to a control signal, a first terminal of the second switch is connected to a second terminal of the driving switch, and a second terminal of the second switch is connected to the other terminal of the light-emitting element;
- a third switch, and a control terminal of the third switch is connected to the second scanning signal, wherein the third switch pulls down the second terminal of the driving switch or the second terminal of the second switch to a low voltage level when the third switch is controlled to be turned on under a control of the second scanning signal; and
- a storage capacitor, a first terminal of the storage capacitor is connected to the control terminal of the driving switch, and a second terminal of the storage capacitor is connected to the second terminal of the second switch.

5. The pixel compensation circuit according to claim 4, wherein, the second terminal of the third switch is connected to the second terminal of the second switch, and the first terminal of the third switch is connected to the control signal.

6. The pixel compensation circuit according to claim 4, wherein, the second terminal of the third switch is connected to the second terminal of the second switch, and the first terminal of the third switch is connected to a detection voltage.

7. The pixel compensation circuit according to claim 4, wherein, the second terminal of the third switch is connected to the second terminal of the driving switch, and the first terminal of the third switch is connected to a detection voltage.

8. The pixel compensation circuit according to claim 4, wherein, each of the first switch, the second switch, the third switch and the driving switch is a thin-film transistor.

9. The pixel compensation circuit according to claim 4, wherein, the light-emitting element is an organic light-emitting diode.

10. The pixel compensation circuit according to claim 4, wherein, the power source voltage is greater than the common voltage.

11. A driving method for the pixel compensation circuit as claimed in claim 4, wherein, the driving method includes:
- in a first stage, turning on the first switch and the third switch; turning off the second switch and the driving switch; perform a pixel initialization; writing a reference signal to the first terminal of the first switch; and writing a low voltage level to the second terminal of the storage capacitor;
- in a second stage, turning on the first switch, the second switch and the driving switch; turning off the third switch, wherein the control terminal of the driving switch is maintained at a low voltage level, the power source charges the second terminal of the storage capacitor through the driving switch; when charging of the second terminal of the storage capacitor is finished, turning off the driving switch, and the storage capacitor stores a voltage difference between the control terminal and the second terminal of the driving switch;
- in a third stage, turning on the first switch, turning off the second switch and the third switch, wherein the driving switch is maintained in a nonconductive status, the first terminal of the storage capacitor is written with the data signal, the voltage level of the second terminal of the storage capacitor is jumped, and the storage capacitor stores the voltage difference at two terminals of the storage capacitor after jumped; and
- in a fourth stage, turning on the second switch, turning off the first switch and the third switch, wherein the control terminal and the second terminal of the driving switch is maintained in a conductive status, the storage capacitor is maintained with the voltage difference in the previous stage, and the light-emitting element is driven to emit light.

12. The driving method for the pixel compensation circuit according to claim 11, wherein when the first scanning signal is at a high level, the first switch is controlled to be turned on, when the first scanning signal is at a low level, the first switch is controlled to be turned off;
- when the control signal is at a high level, the second switch is controlled to be turned on, when the control signal is at a low level, the second switch is controlled to be turned off; and
- when the second scanning signal is at a high level, the third switch is controlled to be turned on, when the second scanning signal is at a low level, the third switch is controlled to be turned off.

* * * * *